(12) United States Patent
Tanimura et al.

(10) Patent No.: US 9,799,517 B2
(45) Date of Patent: Oct. 24, 2017

(54) APPARATUS AND METHOD FOR LIGHT-IRRADIATION HEAT TREATMENT

(71) Applicant: SCREEN Holdings Co., Ltd., Kyoto (JP)

(72) Inventors: Hideaki Tanimura, Kyoto (JP); Kaoru Matsuo, Kyoto (JP); Kazuhiko Fuse, Kyoto (JP); Shinichi Kato, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 15/183,893

(22) Filed: Jun. 16, 2016

(65) Prior Publication Data

US 2017/0011922 A1    Jan. 12, 2017

(30) Foreign Application Priority Data

Jul. 6, 2015    (JP) ................................. 2015-135256

(51) Int. Cl.
*H01L 21/324*    (2006.01)
*H01L 21/225*    (2006.01)
*H05B 3/00*    (2006.01)
*H01L 21/67*    (2006.01)

(52) U.S. Cl.
CPC ........ *H01L 21/2253* (2013.01); *H01L 21/324* (2013.01); *H01L 21/67115* (2013.01); *H05B 3/0047* (2013.01)

(58) Field of Classification Search
CPC ............... H01L 21/2253; H01L 21/324; H01L 21/67115; H05B 3/0047
See application file for complete search history.

(56) References Cited

U.S. PATENT DOCUMENTS

| | | | |
|---|---|---|---|
| 4,649,261 A | 3/1987 | Sheets | 219/390 |
| 6,331,212 B1 | 12/2001 | Mezey, Sr. | 118/725 |
| 2001/0046768 A1 | 11/2001 | Mezey, Sr. | 438/680 |
| 2003/0183612 A1 | 10/2003 | Timans et al. | 219/390 |
| 2012/0244725 A1* | 9/2012 | Fuse | H01L 21/26513 438/799 |
| 2017/0011923 A1* | 1/2017 | Tanimura | H01L 21/2253 |

FOREIGN PATENT DOCUMENTS

| | | |
|---|---|---|
| JP | 60-258928 | 12/1985 |
| JP | 2005-527972 | 9/2005 |
| TW | 529059 | 4/2003 |
| WO | WO 03/085343 A1 | 10/2003 |

OTHER PUBLICATIONS

Taiwanese Office Action (Application No. 105118624) dated Jun. 30, 2017 and its partial English translation.

\* cited by examiner

*Primary Examiner* — Selim Ahmed
(74) *Attorney, Agent, or Firm* — Ostrolenk Faber LLP

(57) ABSTRACT

Light is applied for preheating from a halogen lamp to a lower surface of a semiconductor wafer supported on a susceptor within a chamber. Thereafter, flash light is applied for flash heating from a flash lamp to an upper surface of the semiconductor wafer. Treatment gas supplied from a gas supply source is heated by a heater, and supplied into the chamber. A flow amount control valve is provided to increase a flow amount of the treatment gas supplied into the chamber. Contaminants discharged from a film of the semiconductor wafer during heat treatment are discharged to the outside of the chamber with a gas flow formed by a large amount of high-temperature treatment gas supplied into the chamber to reduce contamination inside the chamber.

5 Claims, 7 Drawing Sheets

F I G . 2
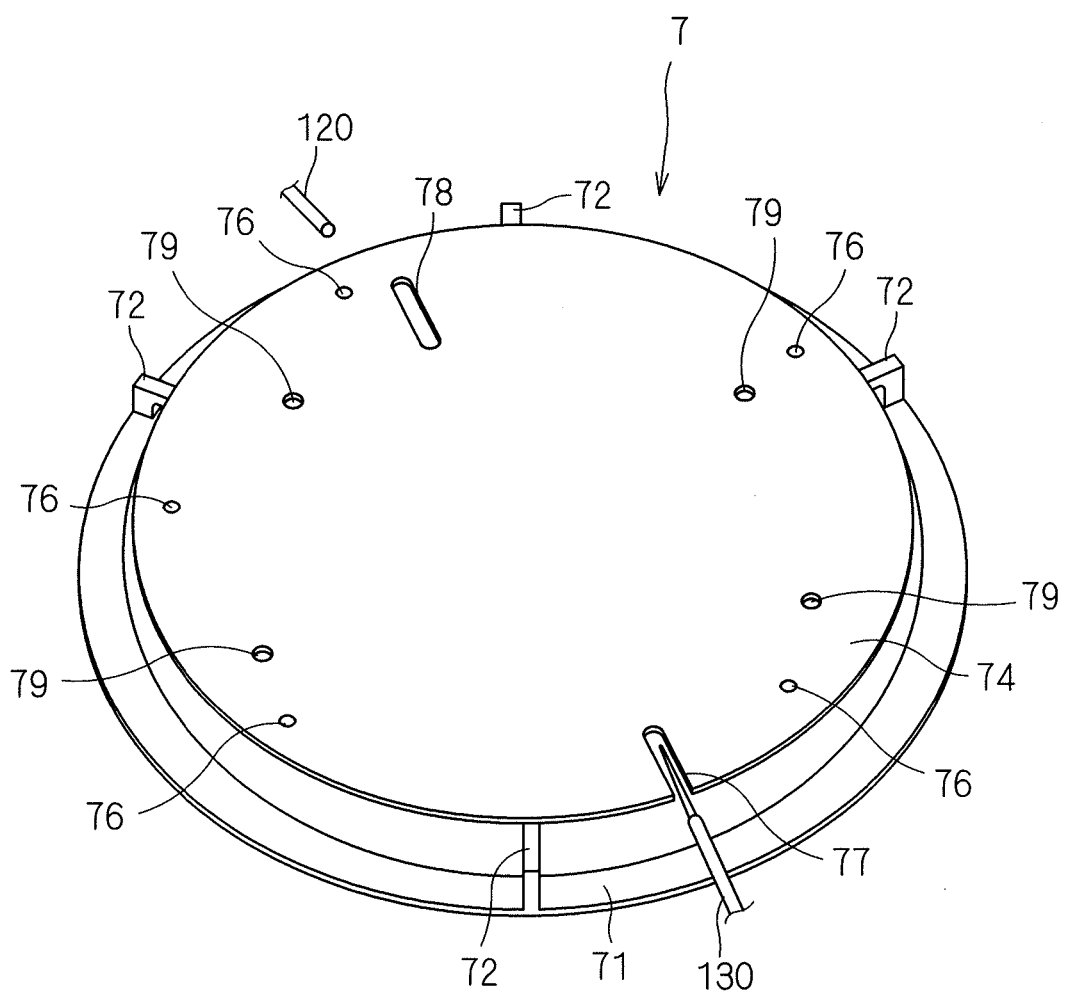

F I G . 4
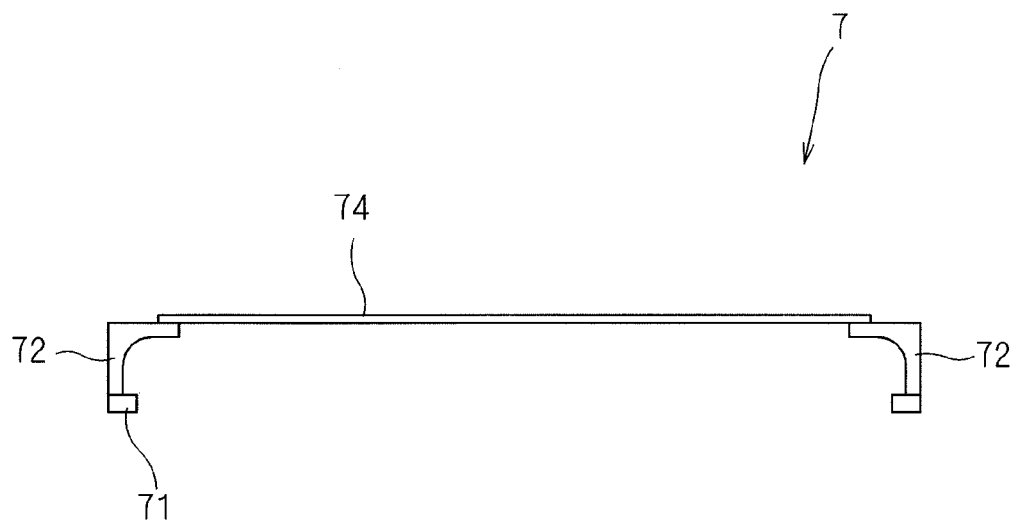

F I G. 5
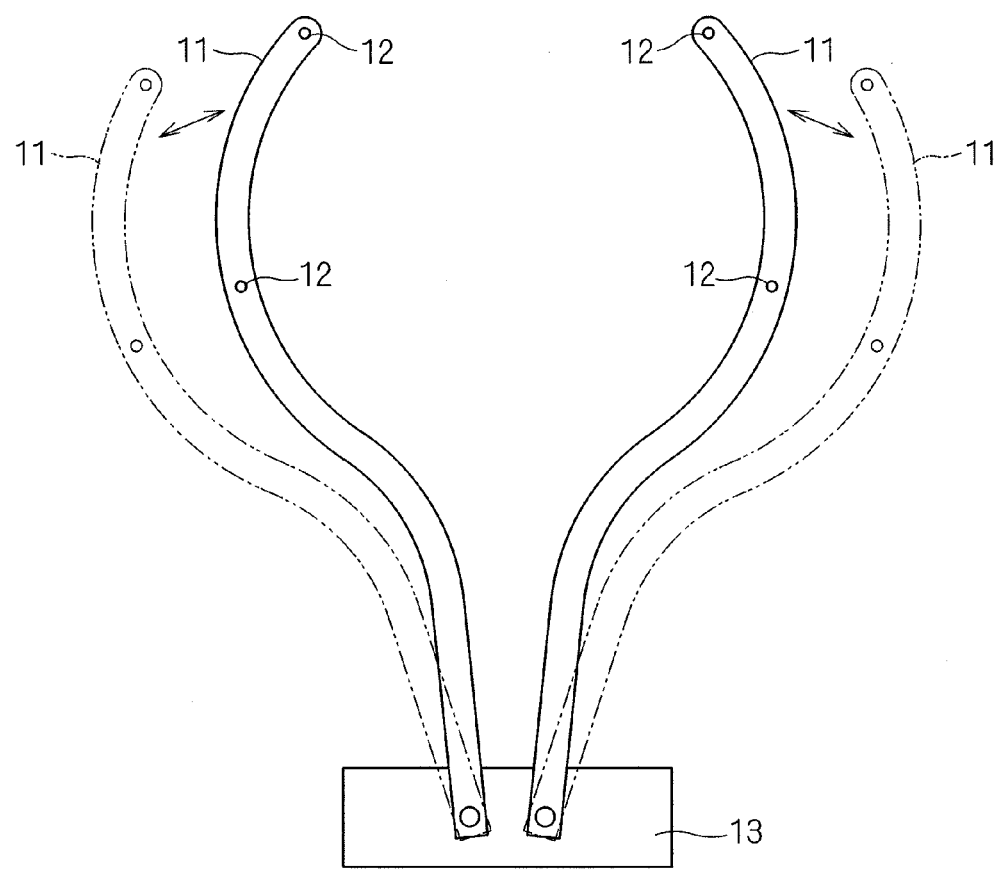

APPARATUS AND METHOD FOR LIGHT-IRRADIATION HEAT TREATMENT

BACKGROUND OF THE INVENTION

Field of the Invention

The present invention relates to a heat treatment apparatus and a heat treatment method for heating a sheet precision electronic substrate (hereinafter, simply referred to as a "substrate"), such as a semiconductor wafer, by irradiating the substrate with light.

Description of the Background Art

In the process of manufacturing a semiconductor device, the introduction of impurities is an essential step for forming pn junctions in a semiconductor wafer. At present, it is common to introduce impurities by ion implantation and subsequent annealing. Ion implantation is a technique for physically doping impurities by causing impurity elements such as boron (B), arsenic (As), or phosphorus (P) to be ionized and collide with a semiconductor wafer with a high acceleration voltage. The doped impurities are activated by annealing. At this time, if the annealing time becomes about several seconds or longer, the doped impurities are deeply diffused by heat, and as a result, the junction depth may become too deeper than required and hinder the formation of a good device.

In view of this, flash-lamp annealing (FLA) is recently attracting attention as an annealing technique that allows semiconductor wafers to be heated in an extremely short time. Flash-lamp annealing is a heat treatment technique using xenon flash lamps (hereinafter, "flash lamps" simply referred to indicate xenon flash lamps) to irradiate the surface of a semiconductor wafer with flash light so that the temperature of only the surface of the semiconductor wafer that is doped with impurities is raised in an extremely short time (several milliseconds or less).

The radiation spectral distribution of xenon flash lamps ranges from ultraviolet to near-infrared regions, with the xenon flash lamps having shorter wavelengths than conventional halogen lamps, and approximately coincides with the fundamental absorption band of silicon semiconductor wafers. Thus, in the case where flash light is applied from xenon flash lamps to a semiconductor wafer, less light will be transmitted through the semiconductor wafer and therefore it is possible to quickly raise the temperature of the semiconductor wafer. It has also been found that the temperature of only the vicinity of the surface of the semiconductor wafer will selectively be raised with extremely short-time application of flash light for several milliseconds or less. Thus, extremely short-time temperature rise with the xenon flash lamps enables the impurities to be activated simply without being diffused deeply.

As examples of such a heat treatment apparatus using xenon flash lamps, U.S. Pat. No. 4,649,261 and U.S. 2003/0183612 A1 disclose heat treatment apparatuses that achieve desirable heat treatment with a combination of pulsed light-emitting lamps such as flash lamps that are arranged on the front side of a semiconductor wafer and continuous lighting lamps such as halogen lamps that are arranged on the rear side of the semiconductor wafer. In the heat treatment apparatuses disclosed in U.S. Pat. No. 4,649,261 and U.S. 2003/0183612, a semiconductor wafer is preheated to a certain degree of temperature with, for example, halogen lamps, and then the temperature of the semiconductor wafer is raised to a desired treatment temperature by pulse heating with flash lamps.

Some semiconductor wafers treated with flash-lamp annealing contain various types of films such as a resist film. When flash light is applied for heat treatment to this type of semiconductor wafer containing films, an inner wall of a chamber accommodating the semiconductor wafer, and a structure inside the chamber such as a susceptor may be contaminated. It is estimated that this contamination is caused by adhesion of carbon contaminants to the structure inside the chamber at the time of combustion of the respective films on the semiconductor wafer by flash heating.

Contamination of the structure inside the chamber becomes a contamination source for a subsequent semiconductor wafer. During light irradiation, light reflected on an inner wall surface of the chamber is also applied to the semiconductor wafer. When the inner wall surface of the chamber is contaminated, reflectance at the contaminated portion lowers. In this case, in-plane temperature distribution of the semiconductor wafer becomes non-uniform during irradiation of light. This condition influences a treatment result of flash heating treatment, and produces a bend of the semiconductor wafer in correspondence with the non-uniform temperature distribution. Moreover, in the case of the structure which disposes lamps on both surfaces of the semiconductor wafer as disclosed in U.S. Pat. No. 4,649,261 and US2003/0183612, light transmittance lowers when the susceptor is contaminated.

SUMMARY OF THE INVENTION

The present invention is directed to a heat treatment apparatus which heats a substrate by irradiating the substrate with light.

According to one aspect of the present invention, a heat treatment apparatus includes: a chamber that accommodates a substrate; a susceptor provided in the chamber and supporting the substrate; a light irradiation part that applies light to the substrate supported on the susceptor; a gas supply part that supplies treatment gas into the chamber; and a gas heater that heats the treatment gas supplied from the gas supply part to the chamber.

According to this structure, contaminants discharged from the substrate during heat treatment are discharged to the outside of the chamber with a flow of high-temperature treatment gas formed within the chamber to reduce contamination inside the chamber.

It is preferable that there is further provided a flow amount increasing part that increases a flow amount of the treatment gas supplied from the gas supply part to the chamber.

According to this structure, contaminants are effectively discharged to the outside of the chamber.

The present invention is also directed to a heat treatment method which heats a substrate by irradiating the substrate with light.

According to another aspect of the present invention, a heat treatment method includes steps of: (a) supporting a substrate on a susceptor within a chamber; (b) supplying treatment gas into the chamber; and (c) applying light to the substrate supported on the susceptor. The step (b) includes a step of (b-1) heating the treatment gas supplied to the chamber.

According to this structure, contaminants discharged from the substrate during heat treatment are discharged to the outside of the chamber with a flow of high-temperature treatment gas formed within the chamber to reduce contamination inside the chamber.

It is preferable that the step (b) further includes a step of (b-2) increasing a flow amount of the treatment gas supplied to the chamber.

According to this structure, contaminants are effectively discharged to the outside of the chamber.

Accordingly, an object of the present invention is to reduce contamination within the chamber.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view of an overall external view of a holder;

FIG. 4 is a side view of the holder as viewed from one side;

FIG. 5 is a plan view of a transfer mechanism;

DESCRIPTION OF THE PREFERRED EMBODIMENTS

Hereinafter, a preferred embodiment of the present invention will be described in detail with reference to the drawings.

Figure 1:
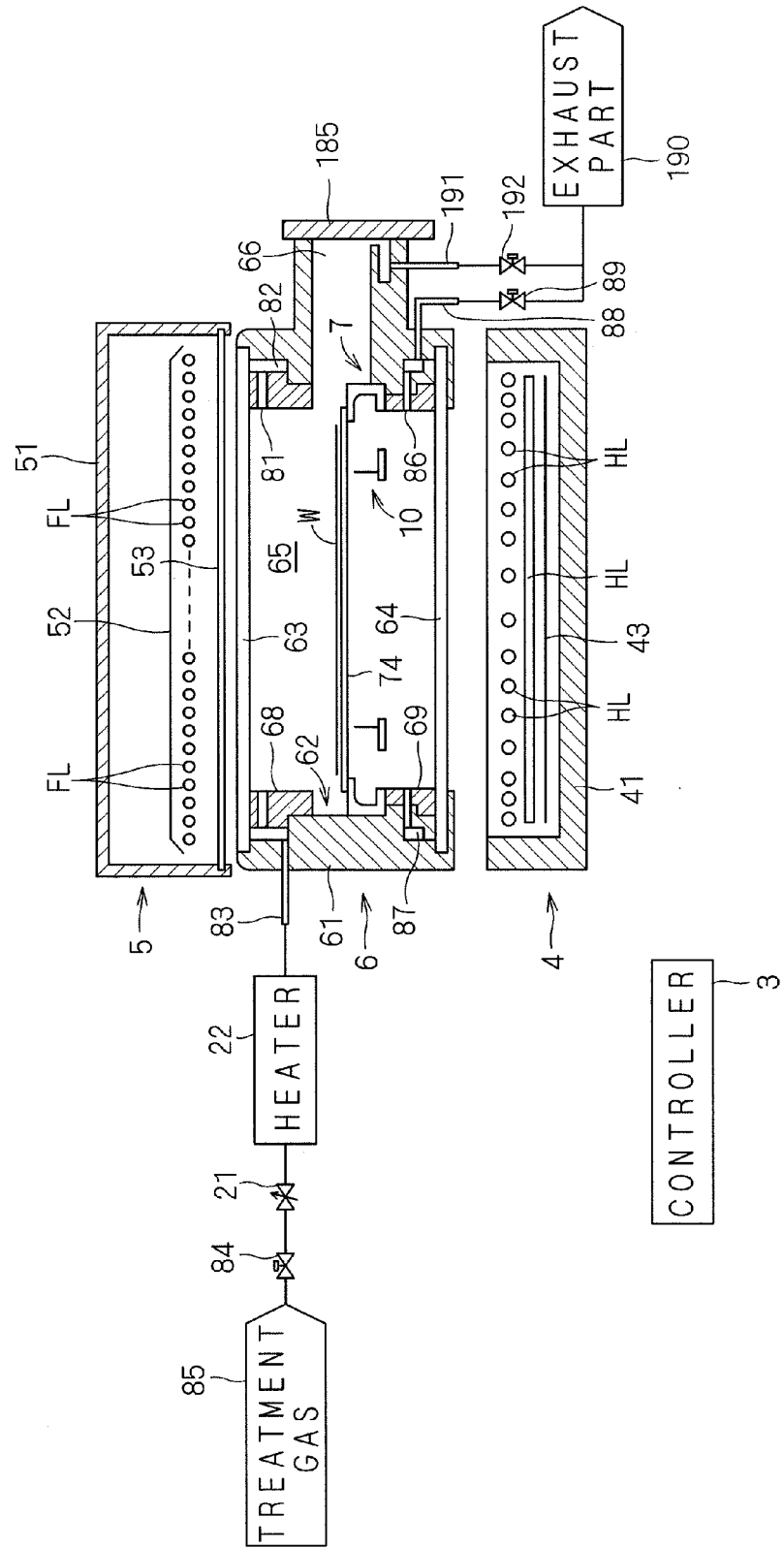
FIG. 1 is a longitudinal cross-sectional view illustrating a configuration of a heat treatment apparatus according to the present invention.

FIG. 1 is a longitudinal cross-sectional view illustrating a configuration of a heat treatment apparatus 1 according to the present invention. The heat treatment apparatus 1 of this preferred embodiment is a flash-lamp annealing apparatus for heating a disk-shaped semiconductor wafer W as a substrate by irradiating the semiconductor wafer W with flash light. The size of the semiconductor wafer W to be treated is not particularly limited. For example, the semiconductor wafer W has a diameter of 300 mm or 450 mm. The semiconductor wafer W is doped with impurities before being transported into the heat treatment apparatus 1, and the doped impurities are activated through heat treatment by the heat treatment apparatus 1. To facilitate understanding, the dimensions and number of each part are exaggerated or simplified as necessary in FIG. 1 and subsequent drawings.

The heat treatment apparatus 1 includes a chamber 6 that houses the semiconductor wafer W, a flash heater 5 with a plurality of built-in flash lamps FL, and a halogen heater 4 with a plurality of built-in halogen lamps HL. The flash heater 5 is provided above the chamber 6, and the halogen heater 4 is provided below the chamber 6. The heat treatment apparatus 1 further includes, within the chamber 6, a holder 7 that holds the semiconductor wafer W in a horizontal position and a transfer mechanism 10 for transferring the semiconductor wafer W between the holder 7 and the outside of the heat treatment apparatus 1. The heat treatment apparatus 1 includes a mechanism which supplies heated treatment gas into the chamber 6. The heat treatment apparatus 1 further includes a controller 3 that controls operating mechanisms located in the halogen heater 4, the flash heater 5, and the chamber 6 for heat treatment of the semiconductor wafer W.

The chamber 6 is configured by mounting quartz chamber windows on the top and bottom of a tubular chamber side portion 61. The chamber side portion 61 has a generally tubular shape that is open at the top and the bottom, the opening at the top being equipped with and closed by an upper chamber window 63 and the opening at the bottom being equipped with and closed by a lower chamber window 64. The upper chamber window 63, which forms the ceiling of the chamber 6, is a disc-shaped member made of quartz and functions as a quartz window that allows flash light emitted from the flash heater 5 to pass through into the chamber 6. The lower chamber window 64, which forms the floor of the chamber 6, is also a disc-shaped member made of quartz and functions as a quartz window that allows light emitted from the halogen heater 4 to pass through into the chamber 6.

A reflection ring 68 is mounted on the upper part of the inner wall surface of the chamber side portion 61, and a reflection ring 69 is mounted on the lower part thereof. Both of the reflection rings 68 and 69 have an annular shape. The upper reflection ring 68 is mounted by being fitted from above the chamber side portion 61. The lower reflection ring 69 is mounted by being fitted from below the chamber side portion 61 and fastened with screws (not shown). In other words, the reflection rings 68 and 69 are both removably mounted on the chamber side portion 61. The chamber 6 has an inner space that is surrounded by the upper chamber window 63, the lower chamber window 64, the chamber side portion 61, and the reflection rings 68 and 69 and that is defined as a heat treatment space 65.

With the reflection rings 68 and 69 mounted on the chamber side portion 61, the chamber 6 has a recessed portion 62 in its inner wall surface. That is, the recessed portion 62 is formed by being surrounded by a central portion of the inner wall surface of the chamber side portion 61 on which the reflection rings 68 and 69 are not mounted, a lower end face of the reflection ring 68, and an upper end face of the reflection ring 69. The recessed portion 62 is horizontally formed in an annular shape in the inner wall surface of the chamber 6 and surrounds the holder 7 that holds the semiconductor wafer W.

The chamber side portion 61 and the reflection rings 68 and 69 are each made of a metal material (e.g., stainless steel) having excellent strength and heat resistance. The inner circumferential surfaces of the reflection rings 68 and 69 are mirror-finished by electrolytic nickel plating.

The chamber side portion 61 has a transport opening (throat) 66 through which the semiconductor wafer W is transported into and out of the chamber 6. The transport opening 66 is openable and closable with a gate valve 185. The transport opening 66 is communicatively connected to the outer circumferential surface of the recessed portion 62. When opened by the gate valve 185, the transport opening 66 allows the semiconductor wafer W to be transported into and out of the heat treatment space 65 from the transport opening 66 through the recessed portion 62. When the transport opening 66 is closed by the gate valve 185, the heat treatment space 65 in the chamber 6 becomes an enclosed space.

The chamber 6 also includes a gas supply port 81 in the upper part of the inner wall. The gas supply port 81 is a port through which treatment gas is supplied to the heat treatment space 65. The gas supply port 81 is formed at a position above the recessed portion 62 and may be formed in the reflection ring 68. The gas supply port 81 is communicatively connected to a gas supply pipe 83 via a buffer space 82 that is formed in an annular shape inside the side wall of the chamber 6. The gas supply pipe 83 is connected to a gas supply source 85. A valve 84, a flow amount control valve 21, and a heater 22 are interposed in the path of the gas supply pipe 83. The type of the treatment gas supplied from the gas supply source 85 is not particularly limited, but may be arbitrarily selected in accordance with treatment purposes. For example, the treatment gas may be nitrogen ($N_2$), argon (Ar), helium (He) or other inert gases, or oxygen ($O_2$), hydrogen ($H_2$), chloride ($Cl_2$), hydrogen chloride (HCl), ozone ($O_3$), ammonia ($NH_3$), fluorine-containing gases, or other reactive gases.

When the valve 84 is opened, treatment gas is supplied from the gas supply source 85 into the buffer space 82. The treatment gas flowing into the buffer space 82 spread out in the buffer space 82 which has lower fluid resistance than that of the gas supply port 81. Thereafter, the treatment gas is supplied through the gas supply port 81 into the heat treatment space 65. The flow amount of the treatment gas flowing through the gas supply pipe 83 and reaching the heat treatment space 65 is regulated by the flow amount control valve 21. Accordingly, the gas supply source 85 and the valve 84 correspond to a gas supply part for supplying treatment gas into the chamber 6, while the flow amount control valve 21 corresponds to a flow amount increasing part for increasing the flow amount of the treatment gas supplied to the chamber 6. The flow amount increasing part may be constituted by a massflow controller instead of the flow amount control valve 21.

The heater 22 heats treatment gas flowing in the gas supply pipe 83. The treatment gas heated by the heater 22 is supplied from the gas supply port 81 to the heat treatment space 65. Accordingly, the heater 22 corresponds to a gas heater for heating treatment gas supplied to the chamber 6.

The chamber 6 also has a gas exhaust port 86 through which the gas in the heat treatment space 65 is exhausted, in the lower part of the inner wall. The gas exhaust port 86 is formed at a position below the recessed portion 62 and may be formed in the reflection ring 69. The gas exhaust port 86 is communicatively connected to a gas exhaust pipe 88 via a buffer space 87 that is formed in an annular shape inside the side wall of the chamber 6. The gas exhaust pipe 88 is connected to an exhaust part 190. The gas exhaust pipe 88 has a valve 89 interposed on the way of its path. When the valve 89 opens, the gas in the heat treatment space 65 is discharged from the gas exhaust port 86 through the buffer space 87 into the gas exhaust pipe 88. A configuration is also possible in which a plurality of gas supply ports 81 and a plurality of gas exhaust ports 86 are provided along the circumference of the chamber 6 or in which the gas supply port 81 and the gas exhaust port 86 have slit shapes. The gas supply source 85 and the exhaust part 190 may be mechanisms provided in the heat treatment apparatus 1, or may be utilities in a factory where the heat treatment apparatus 1 is installed.

One end of the transport opening 66 is also connected to a gas exhaust pipe 191 through which the gas in the heat treatment space 65 is discharged. The gas exhaust pipe 191 is connected to the exhaust part 190 via a valve 192. When the valve 192 opens, the gas in the chamber 6 is discharged through the transport opening 66.

Figure 3:
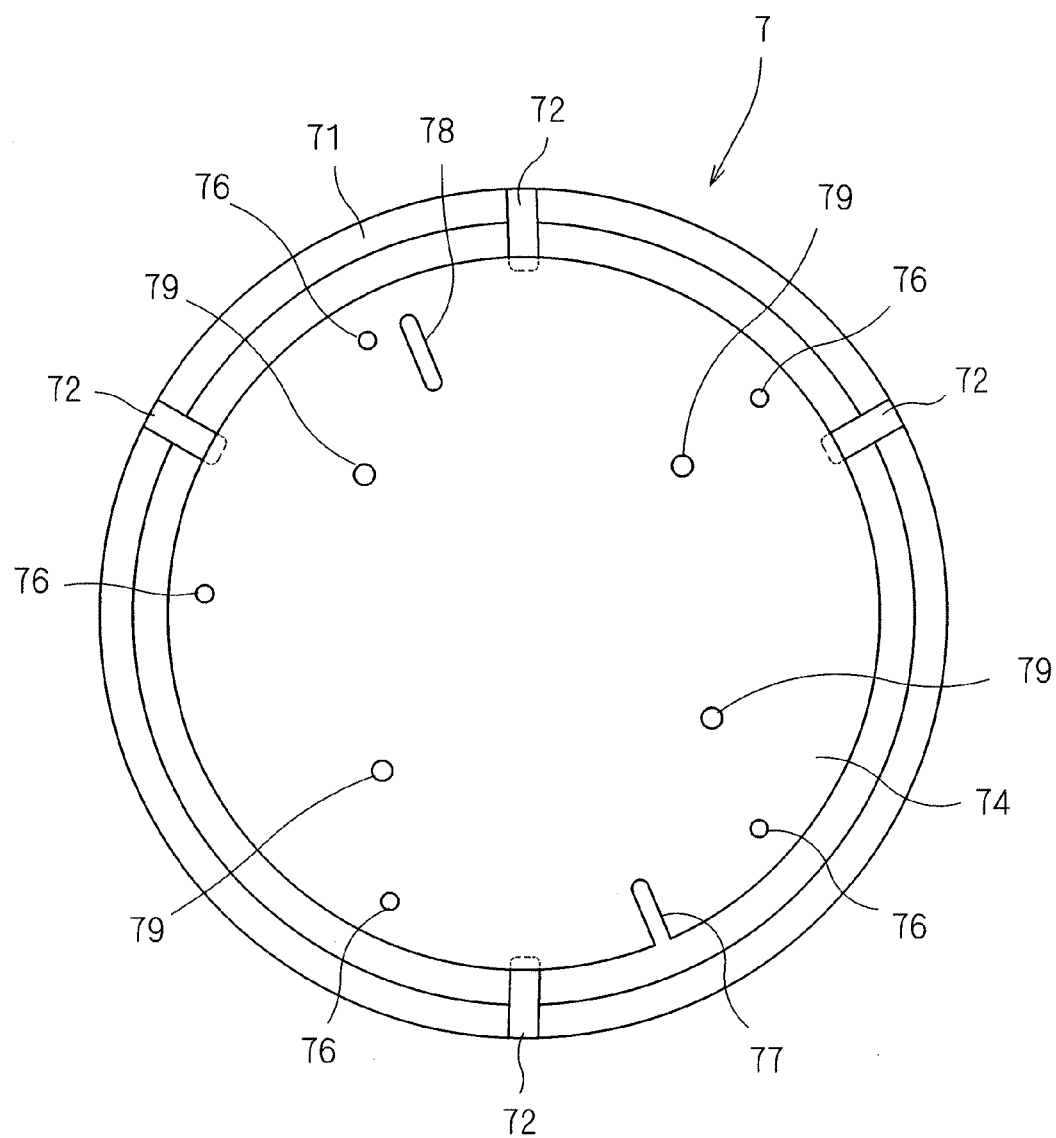
FIG. 3 is a plan view of the holder as viewed from above.

FIG. 2 is a perspective view illustrating an overall external view of the holder 7. FIG. 3 is a plan view of the holder 7 as viewed from above, and FIG. 4 is a side view of the holder 7 as viewed from one side. The holder 7 includes a base ring 71, connecting parts 72, and a susceptor 74. The base ring 71, the connecting parts 72, and the susceptor 74 are all made of quartz. That is, the entire holder 7 is made of quartz.

The base ring 71 is a quartz member having an annular shape. The base ring 71 is placed on the bottom face of the recessed portion 62 and thereby supported on the wall surface of the chamber 6 (see FIG. 1). On the upper surface of the annular base ring 71, a plurality of (in the present embodiment, four) connecting parts 72 are provided upright along the circumference of the base ring 71. The connecting parts 72 are also quartz members and fixedly attached to the base ring 71 by welding. Note that the base ring 71 may have an arc shape that is an annular shape with a missing part.

The flat plate-like susceptor 74 is supported by the four connecting parts 72 provided on the base ring 71. The susceptor 74 is a generally circular flat plate-like member made of quartz. The diameter of the susceptor 74 is greater than the diameter of the semiconductor wafer W. That is, the susceptor 74 has a plane size greater than the plane size of the semiconductor wafer W. On the upper surface of the susceptor 74, a plurality of (in the present embodiment, five) guide pins 76 are provided upright. The five guide pins 76 are provided along the circumference of a circle that is concentric with the outer circumferential circle of the susceptor 74. The diameter of the circle along which the five guide pins 76 are located is slightly greater than the diameter of the semiconductor wafer W. Each guide pin 76 is also made of quartz. Note that the guide pins 76 may be made integrally with the susceptor 74 from a quartz ingot, or may be processed separately and attached to the susceptor 74 by methods such as welding.

The four connecting parts 72 provided upright on the base ring 71 and the underside of the peripheral portion of the susceptor 74 are fixedly attached to each other by welding. That is, the susceptor 74 and the base ring 71 are fixedly coupled to each other by the connecting parts 72, which makes the holder 7 an integral molding member of quartz. This base ring 71 of the holder 7 is supported on the wall surface of the chamber 6, and thereby the holder 7 is attached to the chamber 6. With the holder 7 attached to the chamber 6, the generally circular plate-like susceptor 74 is in a horizontal position (a position at which the normal coincides with the vertical direction). The semiconductor wafer W transported into the chamber 6 is placed and held in a horizontal position on the susceptor 74 of the holder 7 attached to the chamber 6. By disposing the semiconductor wafer W inward of the circle formed by the five guide pins 76, a positional shift of the semiconductor wafer W in the horizontal direction is prevented. Note that the number of guide pins 76 is not limited to five, and may be an arbitrary number as long as the positional shift of the semiconductor wafer W is prevented.

As illustrated in FIGS. 2 and 3, the susceptor 74 has a vertically penetrating opening 78 and a cut-out portion 77. The cut-out portion 77 is provided to pass through the tip of a probe of a contact-type thermometer 130 using a thermocouple. On the other hand, the opening 78 is formed to allow a radiation thermometer 120 to receive radiation (infrared light) applied from the lower surface of the semiconductor wafer W held by the susceptor 74. The susceptor 74 further has four through holes 79 that lift pins 12 of the transfer mechanism 10, which will be described later, pass through to transfer the semiconductor wafer W.

Figure 6:
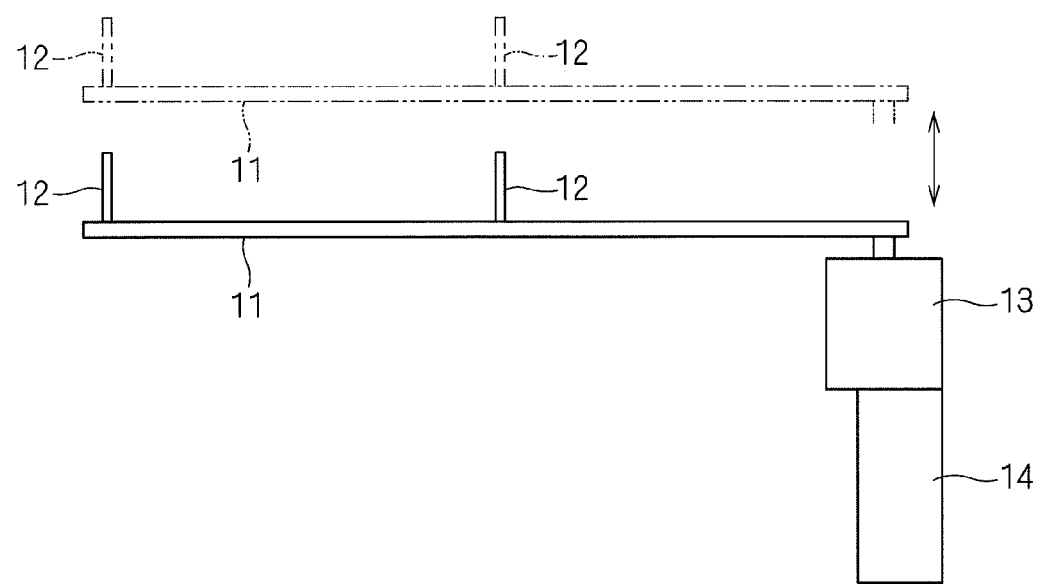
FIG. 6 is a side view of the transfer mechanism.

FIG. 5 is a plan view of the transfer mechanism 10. FIG. 6 is a side view of the transfer mechanism 10. The transfer mechanism 10 includes two transfer arms 11. The transfer arms 11 have an arc shape that extends substantially along the annular recessed portion 62. Each transfer arm 11 has two upright lift pins 12. Each transfer arm 11 is pivotable by a horizontal movement mechanism 13. The horizontal movement mechanism 13 horizontally moves the pair of transfer arms 11 between a transfer operation position (position indicated by the solid line in FIG. 5) at which the semiconductor wafer W is transferred to the holder 7 and a retracted position (position indicated by the dashed double-dotted line in FIG. 5) at which the transfer arms 11 do not overlap the semiconductor wafer W held by the holder 7 in a plan view. The horizontal movement mechanism 13 may be a mechanism for separately pivoting the transfer arms 11 by separate motors, or may be a mechanism for using a link mechanism to pivot the pair of transfer arms 11 in conjunction with each other by a single motor.

The pair of transfer arms 11 are also elevated and lowered together with the horizontal movement mechanism 13 by an elevating mechanism 14. When the elevating mechanism 14 elevates the pair of transfer arms 11 at the transfer operation position, a total of four lift pins 12 pass through the through holes 79 (see FIGS. 2 and 3) formed in the susceptor 74, and the upper ends of the lift pins 12 protrude from the upper surface of the susceptor 74. On the other hand, when the elevating mechanism 14 lowers the pair of transfer arms 11 at the transfer operation position to pull the lift pins 12 out of the through holes 79, and the horizontal movement mechanism 13 moves the pair of transfer arms 11 to open the transfer arms 11, each transfer arm 11 moves to its retracted position. The retracted positions of the pair of transfer arms 11 are directly above the base ring 71 of the holder 7. Because the base ring 71 is placed on the bottom face of the recessed portion 62, the retracted positions of the transfer arms 11 are inside the recessed portion 62. Note that, in the vicinity of the area where the driving parts (the horizontal movement mechanism 13 and the elevating mechanism 14) of the transfer mechanism 10 are provided, an exhaust mechanism (not shown) is also provided so that the atmosphere around the driving parts of the transfer mechanism 10 is discharged to the outside of the chamber 6.

Referring back to FIG. 1, the flash heater 5 provided above the chamber 6 is configured to include, inside a casing 51, a light source having a plurality of (in the present embodiment, 30) xenon flash lamps FL and a reflector 52 that is provided to cover the top of the light source. The casing 51 of the flash heater 5 has a lamp-light radiation window 53 attached to the bottom. The lamp-light radiation window 53, which forms the floor of the flash heater 5, is a plate-like quartz window made of quartz. Since the flash heater 5 is disposed above the chamber 6, the lamp-light radiation window 53 opposes the upper chamber window 63. The flash lamps FL apply flash light to the heat treatment space 65 from above the chamber 6 via the lamp-light radiation window 53 and the upper chamber window 63 to perform flash heating for the semiconductor wafer W.

The flash lamps FL are each a rod-shaped lamp having an elongated cylindrical shape and are arrayed in a plane such that their longitudinal directions are parallel to one another along the major surface of the semiconductor wafer W held by the holder 7 (i.e., along the horizontal direction). Thus, a plane formed by the array of the flash lamps FL is also a horizontal plane.

The xenon flash lamps FL each include a rod-shaped glass tube (discharge tube) and a trigger electrode provided on the outer circumferential surface of the glass tube, the glass tube containing a xenon gas sealed therein and including an anode and a cathode that are disposed at opposite ends of the glass tube and connected to a capacitor. Since the xenon gas is electrically an insulator, no electricity passes through the glass tube in a normal state even if electric charge is stored in the capacitor. However, if an electrical breakdown occurs due to the application of a high voltage to the trigger electrode, the electricity stored in the capacitor instantaneously flows through the glass tube, and light is emitted as a result of the excitation of xenon atoms or molecules at that time. These xenon flash lamps FL have the properties of being capable of applying extremely intense light as compared with a continuous lighting light source such as halogen lamps HL because the electrostatic energy previously stored in the capacitor is converted into an extremely short optical pulse of 0.1 to 100 milliseconds. Accordingly, the flash lamps FL are pulse light emission lamps capable of emitting instantaneous light in an extremely short time shorter than one second. The light emission time of the flash lamps FL is controllable by adjusting a coil constant of a lamp power source supplying power to the flash lamps FL.

The reflector 52 is provided above the flash lamps FL to cover all of the flash lamps FL. A basic function of the reflector 52 is to reflect the flash light emitted from the flash lamps FL toward the heat treatment space 65. The reflector 52 is formed of an aluminum alloy plate and has a surface (a surface that faces the flash lamps FL) that is roughened by blasting.

The halogen heater 4 provided below the chamber 6 includes a plurality of (in the present embodiment, 40) built-in halogen lamps HL. The halogen heater 4 is a light irradiation part that heats the semiconductor wafer W with the halogen lamps HL that emit light from below the chamber 6 through the lower chamber window 64 to the heat treatment space 65. Light applied from the halogen heater 4 passes through the susceptor 74 made of quartz, and reaches the lower surface of the semiconductor wafer W supported on the susceptor 74.

Figure 7:
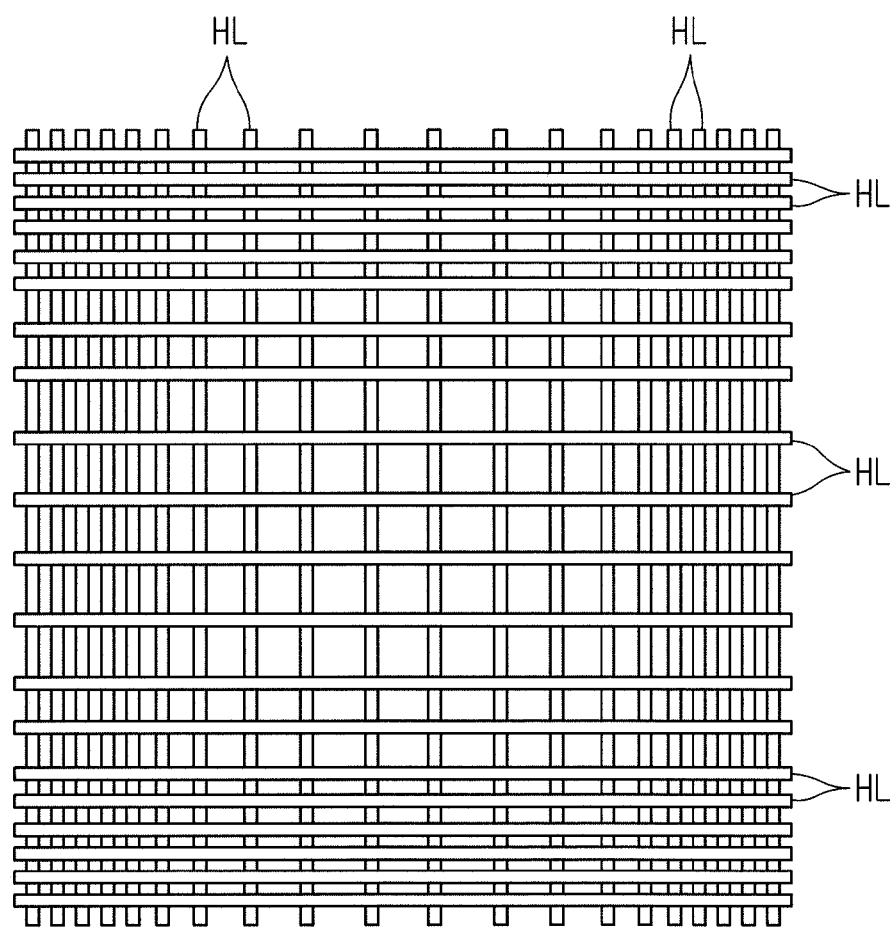
FIG. 7 is a plan view illustrating arrangement of a plurality of halogen lamps.

FIG. 7 is a plan view illustrating arrangement of the plurality of the halogen lamps HL. In the present embodiment, 20 halogen lamps HL are arranged in an upper row, and 20 halogen lamps HL are arranged in a lower row. Each halogen lamp HL is a rod-shaped lamp having an elongated cylindrical shape. The 20 halogen lamps HL in the upper row and the 20 halogen lamps HL in the lower row are respectively arranged such that their longitudinal directions are parallel to one another along the major surface of the semiconductor wafer W held by the holder 7 (i.e., in the horizontal direction). Thus, both of the planes formed by the arrays of the halogen lamps HL in the upper and lower rows are horizontal planes.

As illustrated in FIG. 7, in each of the upper and lower rows, the halogen lamps HL are disposed at a higher density in the region that opposes the peripheral portion of the semiconductor wafer W held by the holder 7 than in the region that opposes the central portion of the semiconductor wafer W. That is, in both of the upper and lower rows, the pitch of arrangement of the halogen lamps HL in the peripheral portion of the array of the halogen lamps HL is shorter than that in the central portion of the array. Accordingly, during heating with irradiation of light from the halogen heater 4, a larger amount of light is applicable to the peripheral portion of the semiconductor wafer W where the temperature easily drops.

Also, a lamp group of the halogen lamps HL in the upper row and a lamp group of the halogen lamps HL in the lower row are arranged to intersect each other in a grid-like pattern. That is, a total of 40 halogen lamps HL is disposed such that the longitudinal lengths of the halogen lamps HL in the upper row and the longitudinal lengths of the halogen lamps HL in the lower row are orthogonal to each other.

The halogen lamps HL are filament-type light sources in which current is applied to a filament disposed in the glass tube to make the filament incandescent and emit light. The glass tube contains a gas that is prepared by introducing a trace amount of halogen elements (e.g., iodine or bromine) into inert gas such as nitrogen or argon. The introduction of halogen elements allows the temperature of the filament to be set to a high temperature while suppressing breakage of the filament. The halogen lamps HL thus have the characteristics of lasting longer than typical incandescent lamps and being able to continuously apply intense light. That is, the halogen lamps HL are continuous lighting lamps that continuously emit light for at least one or more seconds. Moreover, the halogen lamps HL as rod-shaped lamps have a long life, and disposing theses halogen lamps HL in the horizontal direction enhances the efficiently of radiation of the semiconductor wafer W located above the halogen lamps.

The controller 3 controls the above-described various operating mechanisms provided in the heat treatment apparatus 1. The hardware configuration of the controller 3 is the same as that of a commonly used computer. That is, the controller 3 includes a CPU that is a circuit for performing various types of computations, a ROM that is a read-only memory for storing basic programs, a RAM that is a readable/writable memory for storing various types of information, and a magnetic disk for storing software and data for control. The processing in the heat treatment apparatus 1 proceeds as a result of the CPU of the controller 3 executing a predetermined processing program.

Next, the procedure of processing performed on the semiconductor wafer W by the heat treatment apparatus 1 will be described. The semiconductor wafer W to be processed here is a semiconductor substrate doped with impurities (ions) by ion implantation. These impurities are activated through heat treatment (annealing) involving the application of flash light by the heat treatment apparatus 1. The following procedure of processing performed by the heat treatment apparatus 1 is implemented by the controller 3 controlling each operating mechanism of the heat treatment apparatus 1.

First, the valve 84 for supplying a gas and the valves 89 and 192 for exhausting a gas are opened to start the supply and exhaust of a gas into and from the chamber 6. When the valve 84 is opened, treatment gas is supplied from the gas supply port 81 into the heat treatment space 65. According to this preferred embodiment, treatment gas of nitrogen is supplied from the gas supply source 85 into the chamber 6. The flow amount of nitrogen supplied into the chamber 6 is regulated by the flow amount control valve 21. According to this preferred embodiment, this amount is regulated in a range from 50 L/min to 60 L/min.

The heater 22 heats nitrogen passing through the gas supply pipe 83. According to this preferred embodiment, the heater 22 heats nitrogen passing through the gas supply pipe 83 to raise the temperature of the nitrogen to 350° C. However, this temperature of 350° C. is a temperature of nitrogen at the position where the heater 22 is provided. The temperature of the nitrogen raised to 350° C. by the heater 22 drops to approximately 200° C. when the nitrogen reaches the inside of the chamber 6 through the gas supply port 81. This temperature drop is produced by conduction of heat from nitrogen gas to a gas passage route such as the gas supply pipe 83.

When the valve 89 is opened with supply of nitrogen, the gas in the chamber 6 is exhausted from the gas exhaust port 86. By simultaneous operations of supply of nitrogen from the gas supply port 81 and discharge of gas from the gas exhaust port 86, the high-temperature nitrogen gas supplied from above the heat treatment space 65 within the chamber 6 flows downward, and flows out from below the heat treatment space 65. A flow of high-temperature nitrogen gas is thus formed in the heat treatment space 65 within the chamber 6.

When the valve 192 is opened, the gas in the chamber 6 is also exhausted from the transport opening 66. Moreover, the atmosphere around the driving part of the transfer mechanism 10 is also discharged by an exhaust mechanism (not shown). Supply of the high-temperature nitrogen gas into the heat treatment space 65 within the chamber 6 is already started before a start of an initial treatment for a lot (a set of semiconductor wafers W corresponding to targets of the same treatment contents under the same conditions) of the semiconductor wafer W. During the heat treatment of the semiconductor wafer W in the heat treatment apparatus 1, the high-temperature nitrogen gas is continuously supplied into the heat treatment space 65. The amount of the supplied nitrogen gas is changed as appropriate in accordance with the processing step.

Then, the gate valve 185 is opened to open the transport opening 66, and the ion-implanted semiconductor wafer W is transported into the heat treatment space 65 of the chamber 6 through the transport opening 66 by a transport robot located outside the apparatus. The semiconductor wafer W transported into the heat treatment space 65 by the transport robot is moved to a position directly above the holder 7 and stopped. Then, the pair of transfer arms 11 of the transfer mechanism 10 moves horizontally from the retracted position to the transfer operation position and moves upward, so that the lift pins 12 pass through the through holes 79 and protrude from the upper surface of the susceptor 74 to receive the semiconductor wafer W.

After the semiconductor wafer W is placed on the lift pins 12, the transport robot retracts from the heat treatment space 65, and the transport opening 66 is closed with the gate valve 185. Then, the pair of transfer arms 11 moves down, and thereby the semiconductor wafer W is transferred from the transfer mechanism 10 to the susceptor 74 of the holder 7 and held in a horizontal position from the underside. The semiconductor wafer W is held by the holder 7 with its impurity-doped surface with a pattern facing upward. The semiconductor wafer W is also held inward of the five guide pins 76 on the upper surface of the susceptor 74. The pair of transfer arms 11 that has moved down to below the susceptor 74 is retracted to the retracted positions, i.e., to the inside of the recessed portion 62, by the horizontal movement mechanism 13.

After the semiconductor wafer W is held in a horizontal position from the underside by the holder 7 made of quartz, all of the 40 halogen lamps HL of the halogen heater 4 are turned on in unison to start preheating (assist-heating). The halogen light emitted from the halogen lamps HL passes through the lower chamber window 64 and the susceptor 74, which are made of quartz, and is applied to the rear surface (main surface on the side opposite to the front surface) of the semiconductor wafer W. The semiconductor wafer W that has received the light emitted from the halogen lamps HL is preheated, and thereby the temperature of the semiconductor wafer W increases. Note that the transfer arms 11 of the transfer mechanism 10, which have already retracted into the recessed portion 62, will not impede the heating using the halogen lamps HL.

During preheating with the halogen lamps HL, the temperature of the semiconductor wafer W is measured with the contact-type thermometer 130. Specifically, the contact-type thermometer 130 with a built-in thermocouple is brought into contact with the lower surface of the semiconductor wafer W held by the holder 7 through the cut-out portion 77 of the susceptor 74 and measures the increasing wafer temperature. The measured temperature of the semiconductor wafer W is transmitted to the controller 3. The controller 3 controls the output of the halogen lamps HL while monitoring whether the temperature of the semiconductor wafer W raised by the application of light from the halogen lamps HL has reached a predetermined preheating temperature T1. More specifically, the controller 3 performs feedback control of output from the halogen lamps HL on the basis of measurements received from the contact-type thermometer 130 so that the temperature of the semiconductor wafer W becomes the preheating temperature T1. The preheating temperature T1 is set to about 200° C. to 800° C. at which the impurities doped in the semiconductor wafer W are not caused to be diffused by heat, and preferably, may be set to about 350° C. to 600° C. (in the present embodiment, 600° C.). Note that when the temperature of the semiconductor wafer W is increased by the application of light from the halogen lamps HL, the radiation thermometer 120 does not measure the temperature. This is because precise temperature measurement is not possible with the halogen light from the halogen lamps HL entering the radiation thermometer 120 as disturbance light.

After the temperature of the semiconductor wafer W reaches the preheating temperature T1, the controller 3 temporarily maintains the semiconductor wafer W at the preheating temperature T1. More specifically, when the temperature of the semiconductor wafer W measured with the contact-type thermometer 130 reaches the preheating temperature T1, the controller 3 controls output from the halogen lamps HL to maintain the temperature of the semiconductor wafer W approximately at the preheating temperature T1.

This preheating with the halogen lamps HL allows the temperature of the entire semiconductor wafer W to uniformly increase to the preheating temperature T1. In the preheating stage using the halogen lamps HL, the temperature of the peripheral portion of the semiconductor wafer W, where heat more easily dissipates, tends to drop lower than the temperature of the central portion. On the other hand, the halogen lamps HL in the halogen heater 4 are arranged with higher density in the region facing the peripheral portion of the semiconductor wafer W than in the region facing the central portion of the semiconductor wafer W (see FIG. 7). Accordingly, a larger amount of light is applied to the peripheral portion of the semiconductor wafer W where heat easily dissipates. In this condition, the in-plane temperature distribution of the semiconductor wafer W becomes uniform in the preheating stage. Moreover, the mirror-finished inner circumferential surface of the reflection ring 69 attached to the chamber side portion 61 increases the amount of light reflected by the inner circumferential surface of the reflection ring 69 toward the peripheral portion of the semiconductor wafer W. Accordingly, the in-plane temperature distribution of the semiconductor wafer W becomes more uniform in the preheating stage.

After an elapse of a predetermined period from the time when the temperature of the semiconductor wafer W reaches the preheating temperature T1 by application of light from the halogen lamps HL, the flash lamps FL of the flash heater 5 apply flash light to the front surface of the semiconductor wafer W. At this time, part of the flash light emitted from the flash lamps FL travels directly into the chamber 6, and part of the flash light is reflected by the reflector 52 and then travels into the chamber 6. The application of such flash light enables flash heating of the semiconductor wafer W.

The flash heating implemented by the application of flash light from the flash lamps FL allows the surface temperature of the semiconductor wafer W to be increased in a short time. That is, the flash light emitted from the flash lamps FL is extremely short intense flash light that is obtained by converting the electrostatic energy previously stored in the capacitor into an extremely short optical pulse and that has an irradiation time of about 0.1 to 100 milliseconds. The surface temperature of the semiconductor wafer W heated with the flash light emitted from the flash lamps FL instantaneously rises to a treatment temperature T2 of 1000° C. or higher, and then drops rapidly after the activation of impurities doped in the semiconductor wafer W. In this way, the heat treatment apparatus 1 allows the surface temperature of the semiconductor wafer W to rise and drop in an extremely short time, and thereby enables the activation of impurities doped in the semiconductor wafer W while suppressing the diffusion of impurities due to heat. Since the time required for the activation of impurities is extremely shorter than the time required for heat diffusion of impurities, the activation is completed even in such a short time of about 0.1 to 100 milliseconds that causes no diffusion.

After completion of the flash heat treatment and an elapse of a predetermined period of time, the halogen lamps HL are also turned off. The temperature of the semiconductor wafer W thus rapidly drops from the preheating temperature T1. The decreasing temperature of the semiconductor wafer W is measured with the contact-type thermometer 130 or the radiation thermometer 120, and the measurement result is transmitted to the controller 3. On the basis of the measurement result, the controller 3 monitors whether the temperature of the semiconductor wafer W has dropped to a predetermined temperature. After the temperature of the semiconductor wafer W has dropped to the predetermined temperature or less, a pair of the transfer arms 11 of the transfer mechanism 10 are moved horizontally again from the retracted positions to the transfer operation position and moved upward, so that the lift pins 12 protrude from the upper surface of the susceptor 74 and receive the heat-treated semiconductor wafer W from the susceptor 74. Then, the transport opening 66 closed by the gate valve 185 is opened and the semiconductor wafer W placed on the lift pins 12 is transported by the transport robot located outside the apparatus. This completes the heat treatment of the semiconductor wafer W in the heat treatment apparatus 1.

The semiconductor wafer W to be treated contains various types of films such as a resist film and an insulation film in a certain case. When flash light is applied to the semiconductor wafer W containing these films for heat treatment, carbon contaminants may be discharged into the heat treatment space 65 within the chamber 6 as a result of combustion of the films and volatilization of residual solvent components, for example. When the contaminants diffused into the heat treatment space 65 adhere to the inner wall surface of the chamber 6 or the structure inside the chamber such as the susceptor 74, the contaminant adhesion portion is contaminated. This contamination becomes not only a contamination source for a subsequent semiconductor wafer W, but also a factor causing disorder of illuminance distribution of the semiconductor wafer W during light irradiation and heating.

According to this embodiment, therefore, high-temperature treatment gas heated by the heater 22 is supplied into the heat treatment space 65 within the chamber 6 to form a gas flow. With the flow of the high-temperature treatment gas through the chamber 6, contaminants discharged from the films of the semiconductor wafer W during heat treatment are discharged to the outside of the chamber 6 for reduction of contamination inside the chamber 6. As a result, contamination of the inner wall surface of the chamber 6, and of the structure inside the chamber such as the susceptor 74 decreases.

For producing an effect of reducing adhesion of contaminants to the structure inside the chamber by utilizing supply of the high-temperature treatment gas, the temperature of the treatment gas passing through the gas supply pipe 83 needs to be raised to 100° C. or higher by the heater 22 at the time of supply of the gas into the chamber 6. The contamination reduction effect increases as the temperature of the treatment gas rises. However, supply of treatment gas having an excessively high temperature influences the heat treatment for the semiconductor wafer W. Accordingly, the treatment gas passing through the gas supply pipe 83 needs to be heated by the heater 22 such that the temperature of the treatment gas is maintained lower than a set treatment temperature of the semiconductor wafer W at the time of supply of the gas into the chamber 6. When multiple levels are set for the treatment temperature of the semiconductor wafer W, the heater 22 heats the treatment gas such that the temperature of the treatment gas supplied into the chamber 6 is maintained lower than the lowest set treatment temperature in the multiple levels. According to this preferred embodiment, the heater 22 heats nitrogen gas passing through the gas supply pipe 83 such that the temperature of the nitrogen gas is maintained lower than the preheating temperature T1 at the time of supply of the gas into the chamber 6.

Moreover, supply of high-temperature treatment gas into the chamber 6 produces a cleaning effect for removing contaminants already adhering to the inner wall surface of the chamber 6 and the structure inside the chamber such as the susceptor 74.

The effect of discharging contaminants to the outside of the chamber 6 increases as the flow amount of treatment gas supplied into the chamber 6 increases. Accordingly, adhesion of contaminants to the structure inside the chamber further decreases with a larger flow amount of the treatment gas. According to this preferred embodiment, the flow amount control valve 21 supplies a larger flow amount of nitrogen gas, i.e., in a range from 50 L/min to 60 L/min, into the chamber 6 instead of a normal flow amount ranging from 20 L/min to 30 L/min. In this case, contaminants are discharged to the outside of the chamber 6 before adhering to the structure inside the chamber. Accordingly, contamination within the chamber 6 more effectively decreases.

Assuming that an inside volume of the chamber 6 is D, the flow amount of treatment gas to be supplied into the chamber 6 may be set in a range from 0.5 D/min to 5 D/min. This large amount of supply of treatment gas into the chamber 6 increases the effect of discharging contaminants to the outside of the chamber 6, thereby effectively reducing contamination within the chamber 6.

While the above has been a description of a preferred embodiment of the present invention, various modifications in addition to those described above may be made to the present invention without departing from the scope and spirit of the invention. According to the preferred embodiment described herein, high-temperature nitrogen gas is supplied into the chamber 6. However, the type of treatment gas is not limited to nitrogen gas, but may be other types such as oxygen and argon. Particularly, supply of highly reactive heated treatment gas such as oxygen into the chamber 6 increases the cleaning effect for removing contaminants already adhering to the structure inside the chamber.

While the flash heater 5 includes 30 flash lamps FL in the above-described preferred embodiment, the present invention is not limited to this example. The flash heater 5 may include an arbitrary number of flash lamps FL. The flash lamps FL are not limited to xenon flash lamps, and may be krypton flash lamps. The number of halogen lamps HL included in the halogen heater 4 is also not limited to 40, and the halogen heater 4 may include an arbitrary number of halogen lamps HL as long as each of the upper and lower rows includes the array of a plurality of halogen lamps.

The light irradiation part which applies light to the semiconductor wafer W for heating is not limited to the flash lamps FL and the halogen lamps HL, but may be a laser beam source.

Also, substrates to be processed by the heat treatment apparatus of the present invention are not limited to semiconductor wafers, and may be glass substrates for use in a flat panel display such as a liquid crystal display device, or substrates for solar cells. The technique of the present invention is also applicable to other applications such as heat treatment of a high dielectric gate insulating film (high-k film), bonding of metal and silicon, and crystallization of polysilicon.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus that heats a substrate by irradiating the substrate with light, comprising:
   a chamber that accommodates the substrate;
   a susceptor provided in said chamber and supporting the substrate;
   a light irradiation part that applies light to the substrate supported on said susceptor;
   a gas supply part that supplies treatment gas into said chamber; and
   a gas heater that heats said treatment gas supplied from said gas supply part to said chamber, wherein said gas heater heats said treatment gas supplied into said chamber to raise a temperature of said treatment gas to 100° C. or higher.

2. The heat treatment apparatus according to claim 1, wherein said treatment gas is nitrogen, oxygen, or argon.

3. The heat treatment apparatus according to claim 1, further comprising a flow amount increasing part that increases a flow amount of said treatment gas supplied from said gas supply part to said chamber.

4. The heat treatment apparatus according to claim 1, wherein said light irradiation part includes a flash lamp that applies flash light to the substrate from one side of said chamber.

5. The heat treatment apparatus according to claim 4, wherein said light irradiation part further includes a halogen lamp that applies light to the substrate from the other side of said chamber.

* * * * *